United States Patent
Roy

(10) Patent No.: US 7,319,622 B1
(45) Date of Patent: Jan. 15, 2008

(54) BITLINE SHIELDING FOR THYRISTOR-BASED MEMORY

(75) Inventor: Richard Roy, Danville, CA (US)

(73) Assignee: T-Ram Semiconductor, Inc., Milpitas, CA (US)

( * ) Notice: Subject to any disclaimer, the term of this patent is extended or adjusted under 35 U.S.C. 154(b) by 303 days.

(21) Appl. No.: 11/174,813

(22) Filed: Jul. 5, 2005

(51) Int. Cl.
*G11C 7/00* (2006.01)

(52) U.S. Cl. .......................... 365/189.11; 365/189.02; 365/230.04

(58) Field of Classification Search .......... 365/189.11, 365/189.02, 189.08, 230.04, 230.03
See application file for complete search history.

(56) References Cited

U.S. PATENT DOCUMENTS

| | | | |
|---|---|---|---|
| 5,644,545 | A | 7/1997 | Fisch |
| 6,236,618 | B1 * | 5/2001 | Roy ....................... 365/230.06 |
| 6,462,359 | B1 | 10/2002 | Nemati et al. |
| 6,583,452 | B1 | 6/2003 | Cho et al. |
| 6,611,452 | B1 | 8/2003 | Han |
| 6,653,174 | B1 | 11/2003 | Cho et al. |
| 6,653,175 | B1 | 11/2003 | Nemati et al. |
| 6,666,481 | B1 | 12/2003 | Horch et al. |
| 6,683,330 | B1 | 1/2004 | Horch et al. |
| 6,686,612 | B1 | 2/2004 | Horch et al. |
| 6,690,038 | B1 | 2/2004 | Cho et al. |
| 6,690,039 | B1 | 2/2004 | Nemati et al. |
| 6,703,646 | B1 | 3/2004 | Nemati et al. |
| 6,721,220 | B2 | 4/2004 | Yoon et al. |
| 6,727,528 | B1 | 4/2004 | Robins et al. |
| 6,734,815 | B1 | 5/2004 | Abdollahi-Alibeik et al. |
| 6,735,113 | B2 | 5/2004 | Yoon et al. |
| 6,756,612 | B1 | 6/2004 | Nemati et al. |
| 6,756,838 | B1 | 6/2004 | Wu et al. |
| 6,767,770 | B1 | 7/2004 | Horch et al. |
| 6,677,271 | B1 | 8/2004 | Robins et al. |
| 6,778,435 | B1 | 8/2004 | Han et al. |
| 6,781,888 | B1 | 8/2004 | Horch et al. |
| 6,785,169 | B1 | 8/2004 | Nemati et al. |
| 6,790,713 | B1 | 9/2004 | Horch |
| 6,804,162 | B1 | 10/2004 | Eldridge et al. |

(Continued)

FOREIGN PATENT DOCUMENTS

WO    WO 02/082504 A2    10/2002

OTHER PUBLICATIONS

Nemati, F. et al., Fully Planar 0.562um2 T-RAM Cell in a 130 nm SOI CMOS logic technology for high-density high-performance SRAMs. IEDM Technical Digest, 2004, IEEE.

*Primary Examiner*—Anh Phung
*Assistant Examiner*—Hien N Nguyen
(74) *Attorney, Agent, or Firm*—The Webostad Firm

(57) ABSTRACT

Method and apparatus for writing and reading information to and from a memory cell. For a read, a write path is used to electrically shield at least one adjacent bitline from a bitline associated with the memory cell to be read, and the memory cell is read while the at least one adjacent bitline is electrically shielded from the bitline associated with the memory cell being read. For a write, the write path is used to electrically shield at the least one adjacent bitline from a bitline associated with a memory cell to be written to; memory cells coupled to a wordline are read and buffered; and the memory cell is written to while the at least one adjacent bitline is electrically shielded from the writing to the memory cell.

7 Claims, 8 Drawing Sheets

U.S. PATENT DOCUMENTS

| | | |
|---|---|---|
| 6,815,734 B1 | 11/2004 | Horch et al. |
| 6,818,482 B1 | 11/2004 | Horch et al. |
| 6,819,278 B1 | 11/2004 | Abdollahi-Alibeik et al. |
| 6,828,176 B1 | 12/2004 | Nemati et al. |
| 6,828,202 B1 | 12/2004 | Horch |
| 6,835,997 B1 | 12/2004 | Horch et al. |
| 6,845,037 B1 | 1/2005 | Han |
| 6,872,602 B1 | 3/2005 | Nemati et al. |
| 6,885,581 B2 | 4/2005 | Nemati et al. |
| 6,888,176 B1 | 5/2005 | Horch et al. |
| 6,888,177 B1 | 5/2005 | Nemati et al. |
| 6,891,205 B1 | 5/2005 | Cho et al. |
| 6,891,774 B1 | 5/2005 | Abdollahi-Alibeik et al. |
| 6,901,021 B1 | 5/2005 | Horch et al. |
| 6,903,987 B2 | 6/2005 | Yoon et al. |
| 6,911,680 B1 | 6/2005 | Horch et al. |
| 6,913,955 B1 | 7/2005 | Horch et al. |
| 6,937,085 B1 | 8/2005 | Samaddar |
| 6,940,772 B1 | 9/2005 | Horch et al. |
| 6,944,051 B1 | 9/2005 | Lee et al. |
| 6,947,349 B1 | 9/2005 | Abdollahi-Alibeik et al. |
| 6,953,953 B1 | 10/2005 | Horch |
| 6,958,931 B1 | 10/2005 | Yoon et al. |
| 6,965,129 B1 | 11/2005 | Horch et al. |
| 6,975,260 B1 | 12/2005 | Abdollahi-Alibeik et al. |
| 6,979,602 B1 | 12/2005 | Horch et al. |
| 6,980,457 B1 | 12/2005 | Horch et al. |
| 6,998,298 B1 | 2/2006 | Horch |
| 6,998,652 B1 | 2/2006 | Horch et al. |
| 7,006,398 B1 | 2/2006 | Yoon et al. |

* cited by examiner

BITLINE SHIELDING FOR THYRISTOR-BASED MEMORY

FIELD OF THE INVENTION

One or more aspects of the invention generally relate to an integrated circuit having memory and, more particularly, to minimizing data dependent voltage signal coupling from an adjacent bitline during single-ended sensing.

BACKGROUND OF THE INVENTION

Conventionally, semiconductor memories such as static random access memory ("SRAM") and dynamic random access memory ("DRAM") are in widespread use. DRAM is very common due to its high density with a cell size typically between $6F^2$ and $8F^2$, where F is a minimum feature size. However, DRAM is relatively slow having access and cycle times commonly near 20 nanoseconds ("ns"). SRAM access and cycle times are typically an order of magnitude faster than DRAM. One of the reasons is that the typical SRAM bit cell provides data and inverse data outputs to be read. However, an SRAM cell is commonly made of four transistors and two resistors or of six transistors, thus leading to a density of approximately $60F^2$ to $100F^2$.

SRAM memory designs based on a negative differential resistance ("NDR") cell, such as a thyristor cell, have been introduced to minimize the size of a conventional SRAM memory. In an array of thyristor-based memory cells, a Thin Capacitive Coupled Thyristor Cell ("TCCT") bit cell has cross-coupled gain within the bit cell but the output is single-ended. Accordingly, coupling such single-ended bit cells to a common bitline may suffer from significant signal attenuation during an access operation of one such bit cell due to state of one or more adjacent bit cells. More particularly, with spacing between bitlines becoming smaller with successive microlithography reductions, capacitive coupling to adjacent bitlines may account for as much as half the total parasitic capacitive load of a bitline. If adjacent bitlines to a bitline being read are both at or moving in an opposite voltage direction to the bitline being read, signal attenuation on the bitline being read could cause significant delay in the time it takes to sample the bitline being read. Additional details regarding a thyristor-based memory cell may be found in Patent Cooperation Treaty ("PCT") International Publication WO 02/082504.

Accordingly, it would be desirable and useful to provide means as part of a bit cell access operation to reduce data dependent cross talk from one or more adjacent bit cells.

SUMMARY OF THE INVENTION

One or more aspects of the invention generally relate to an integrated circuit having memory and, more particularly, to minimizing data dependent voltage signal coupling from an adjacent bitline during single-ended sensing.

An aspect of the invention is an integrated circuit having memory, including: an array having memory cells having bitlines coupled to the memory cells; data input lines coupled to the bitlines via write multiplexers responsive to write signals; a data bus coupled to the bitlines via respective read transistors respectively gated responsive to read signals; a voltage pulling circuit coupled to the data bus; a sense amplifier coupled to the bitlines via the read transistors and the data bus, where the sense amplifier is coupled to receive a reference voltage; and the write signals and the read signals in part configured to shield at least one adjacent bitline to a bitline of a memory cell of the memory cells being read.

Another aspect of the invention is a method for reading information from a memory cell, including: using a write path to electrically shield at least one adjacent bitline from a bitline associated with the memory cell to be read; and reading the memory cell while the at least one adjacent bitline is electrically shielded from the bitline associated with the memory cell being read.

Yet another aspect of the invention is a method for writing information to a memory cell, including: using a write path to electrically shield at least one adjacent bitline from a bitline associated with the memory cell to be written to; reading memory cells coupled to a wordline; buffering information read from the memory cells; and writing to the memory cell while the at least one adjacent bitline is electrically shielded from the writing to the memory cell.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items, however, in alternative embodiments the items may be different. Moreover, for purposes of clarity, a single signal or multiple signals may be referred to or illustratively shown as a signal to avoid encumbering the description with multiple signal lines. Moreover, along those same lines, a multiplexer or a register, among other circuit elements, may be referred to or illustratively shown as a single multiplexer or a single register though such reference or illustration may be representing multiples thereof. Furthermore, though particular signal bit widths, data rates and frequencies may be described herein for purposes of clarity by way of example, it should be understood that the scope of the description is not limited to these particular numerical examples as other values may be used.

Figure 1:
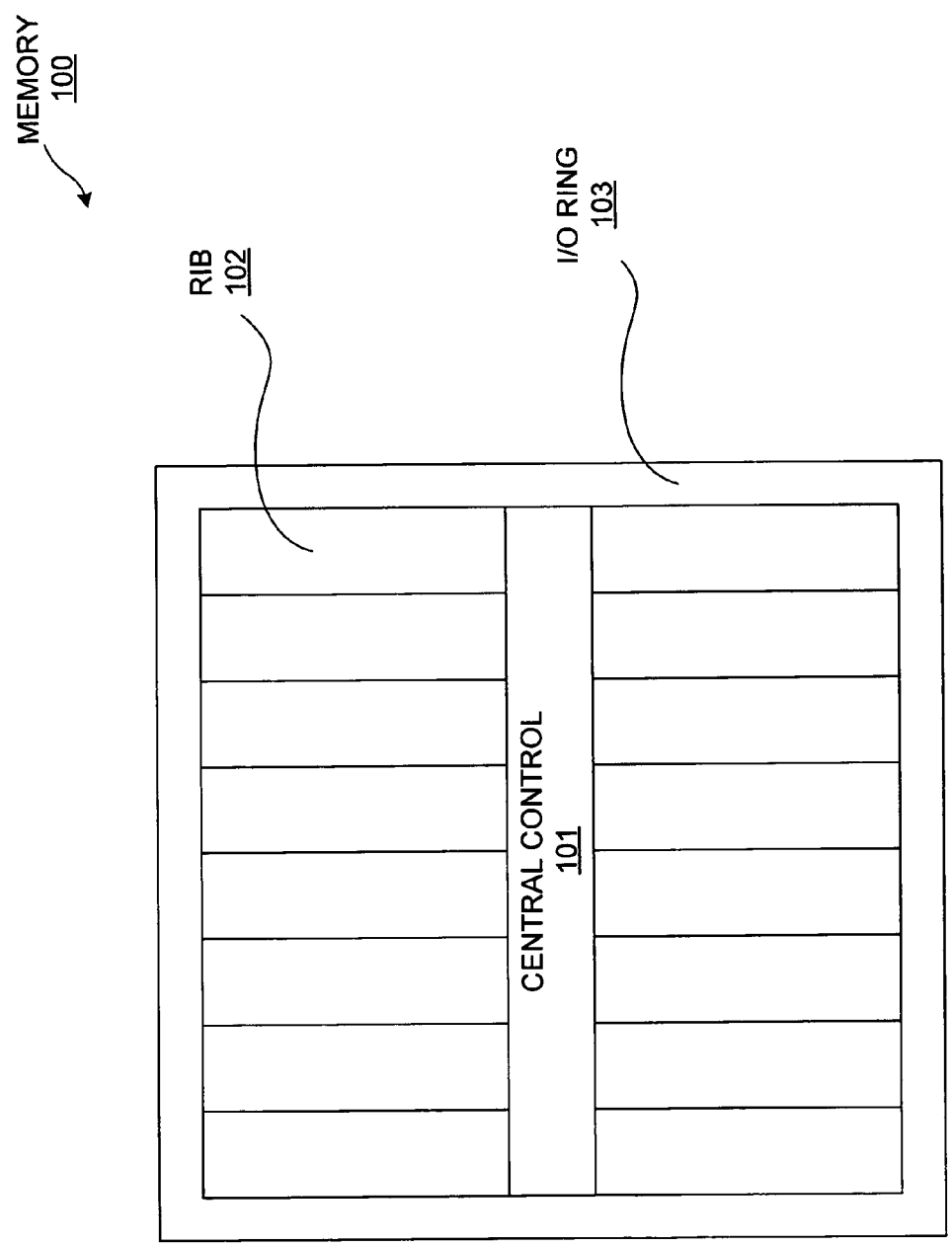
FIG. 1 is a high-level block diagram depicting an exemplary embodiment of a memory integrated circuit.

FIG. 1 is a high-level block diagram depicting an exemplary embodiment of a memory 100. Memory 100 includes ribs 102, central control 101 and input/output ("I/O") ring 103. For the example described herein, specific numeric values are provided for purposes of clarity by way of example. However, it will be appreciated that the particular numerical values used may be increased or decreased without departing from the scope of this disclosure. For the example that follows, it shall be assumed that a rib is 256 wordline ones ("WL1s") by 2304 columns. Moreover, it should be understood that rib 102 includes thyristor-based memory cells, which are more particularly described below.

Figure 2:
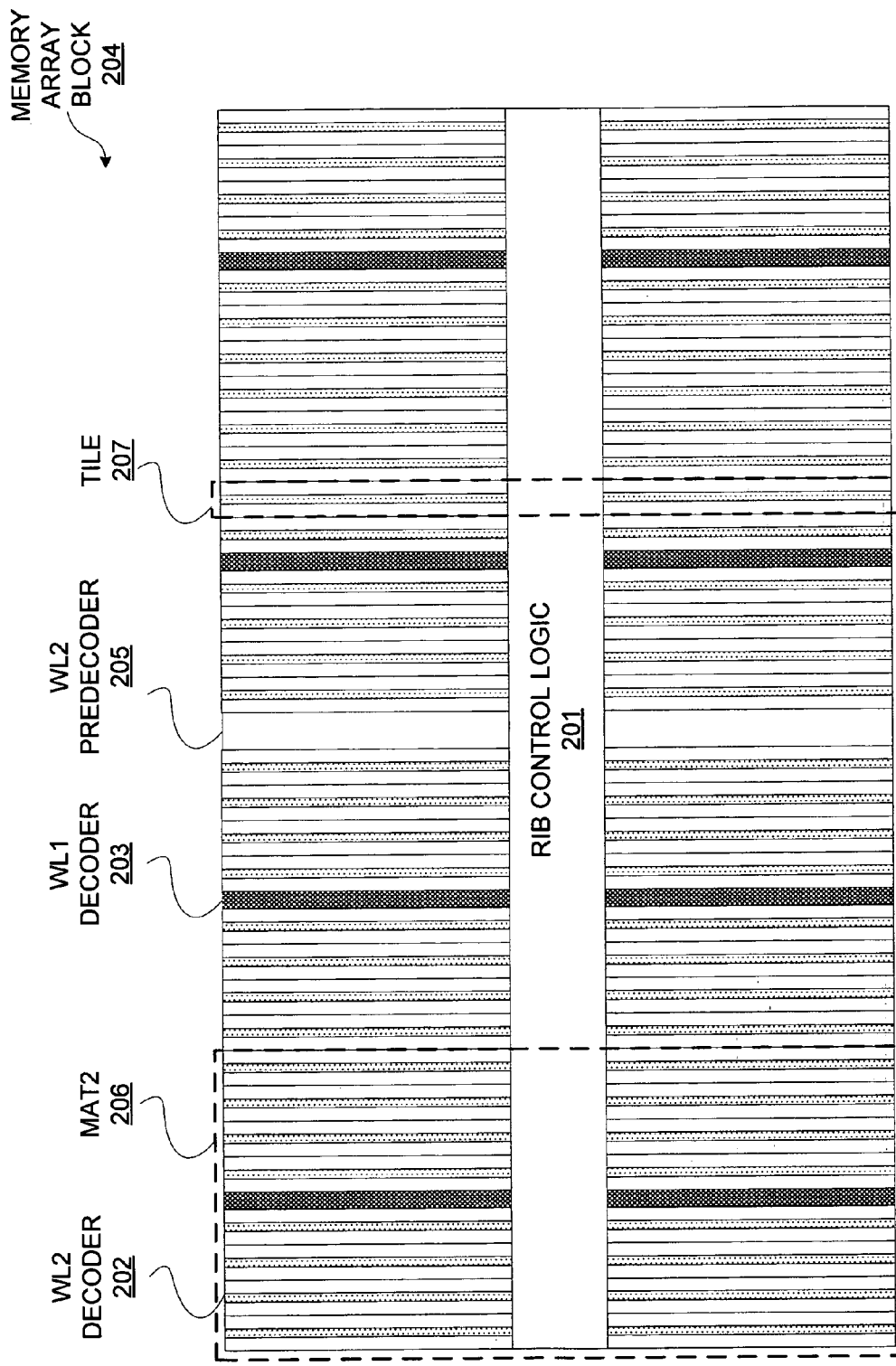
FIG. 2 is a high-level block diagram depicting an exemplary embodiment of a memory array block.

FIG. 2 is a high-level block diagram depicting an exemplary embodiment of a memory array block 204. Each rib 102 of FIG. 1 includes two memory array blocks 204.

Memory array block 204 includes eight MATs, or four MAT2s 206. Each MAT2 206 includes eight tiles 207. Separating two MAT2s 206 on each side of block 204 is a wordline two ("WL2") predecoder 205. Horizontally extending across memory array block 204 is rib control logic 201. It should be understood that each tile 207 includes a WL2 decoder 202. Moreover, it should be understood that each MAT2 includes a WL1 decoder 203.

Figure 3:
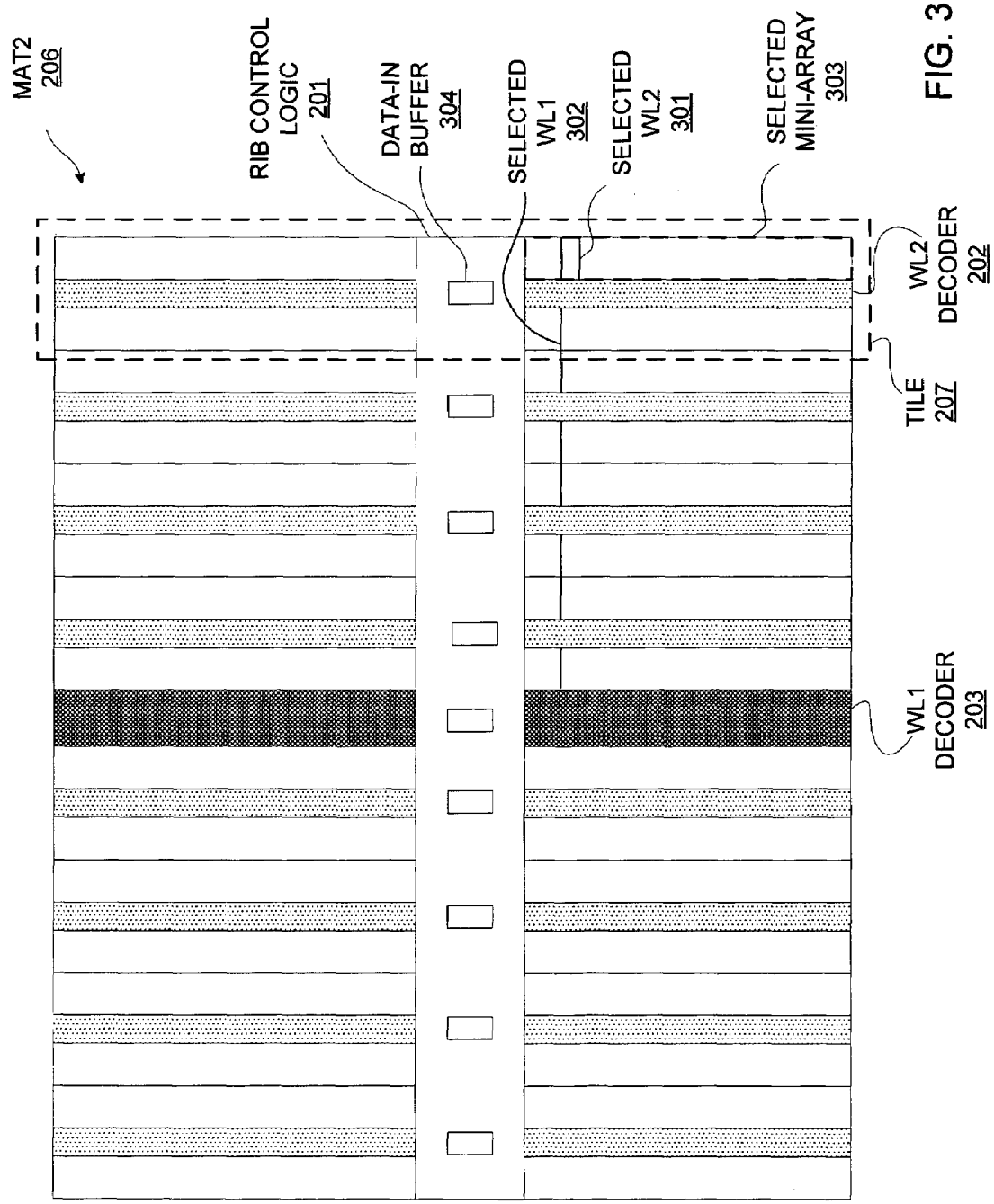
FIG. 3 is a high-level block diagram depicting an exemplary embodiment of a MAT2 of the memory array block of FIG. 2.

FIG. 3 is a high-level block diagram depicting an exemplary embodiment of a MAT2 206. Continuing the above numerical example, each MAT2 206 may provide 288 by 256 arrayed memory cells. Again, each MAT2 206 includes a WL1 decoder 203, eight tiles 207, and a portion of rib control logic 201 having 9 data-in buffers 304. Data-in buffer 304 is configured to support buffering of data to and from memory cells of MAT2 206. Thus, each data-in buffer 304 supports data input to any of tiles 207 of MAT2 206. Continuing the above example, data-in buffer 304 may support a 288 by 256 bit array.

Data-in buffer 304 is for buffering two bits of data, namely an odd bit and an even bit, in association. These buffered bits are to subsequently be written to a memory array. Data-in buffer 304 is for inputting even and odd bits into a memory array, such as a selected mini-array 303, described below in additional detail. Notably, even and odd do not refer to data states, such as a logic 0 and a logic 1.

For an address provided to access a memory array of MAT2 206, for a write operation a selected WL1 302 and selected WL2 301 of a selected mini-array 303 are activated in response to such an address. Notably, continuing the above example, WL2 decoder 202 is used to select 18 bits of a selected WL2 301 of a selected mini-array 303. Continuing the above example, each mini-array is 18 by 128 bits. WL1 decoder 203 is used to select a WL1, e.g., selected WL1 302, which in this example is coupled to 144 memory cells. Moreover, in this example a MAT is 144 bits by 256 columns. As described below in additional detail, only nine bits are read from each selected mini-array 303 though each mini-array is 18 bits wide.

For a memory array architecture described in more detail elsewhere herein, when WL2s 301 are brought to a logic high level to write either a logic 1 or a logic 0 to a thyristor-based memory cell coupled thereto, any data stored on other memory cells coupled to the selected WL2s 301 with the elevated voltage is corrupted. Accordingly, for a write operation, for example, a pre-read of the memory cells not intended to be overwritten on the WL2 to be accessed for such write operation is done to buffer such data for subsequent write back to memory cells of the WL2 accessed. Raising WL2 destroys the previous contents of all 18 memory cells, so this buffering is used for the 9 cells of the 18 that are not being written with new data. Notably, a cache may be used; however, for purposes of clarity data buffering is described.

Figure 4:
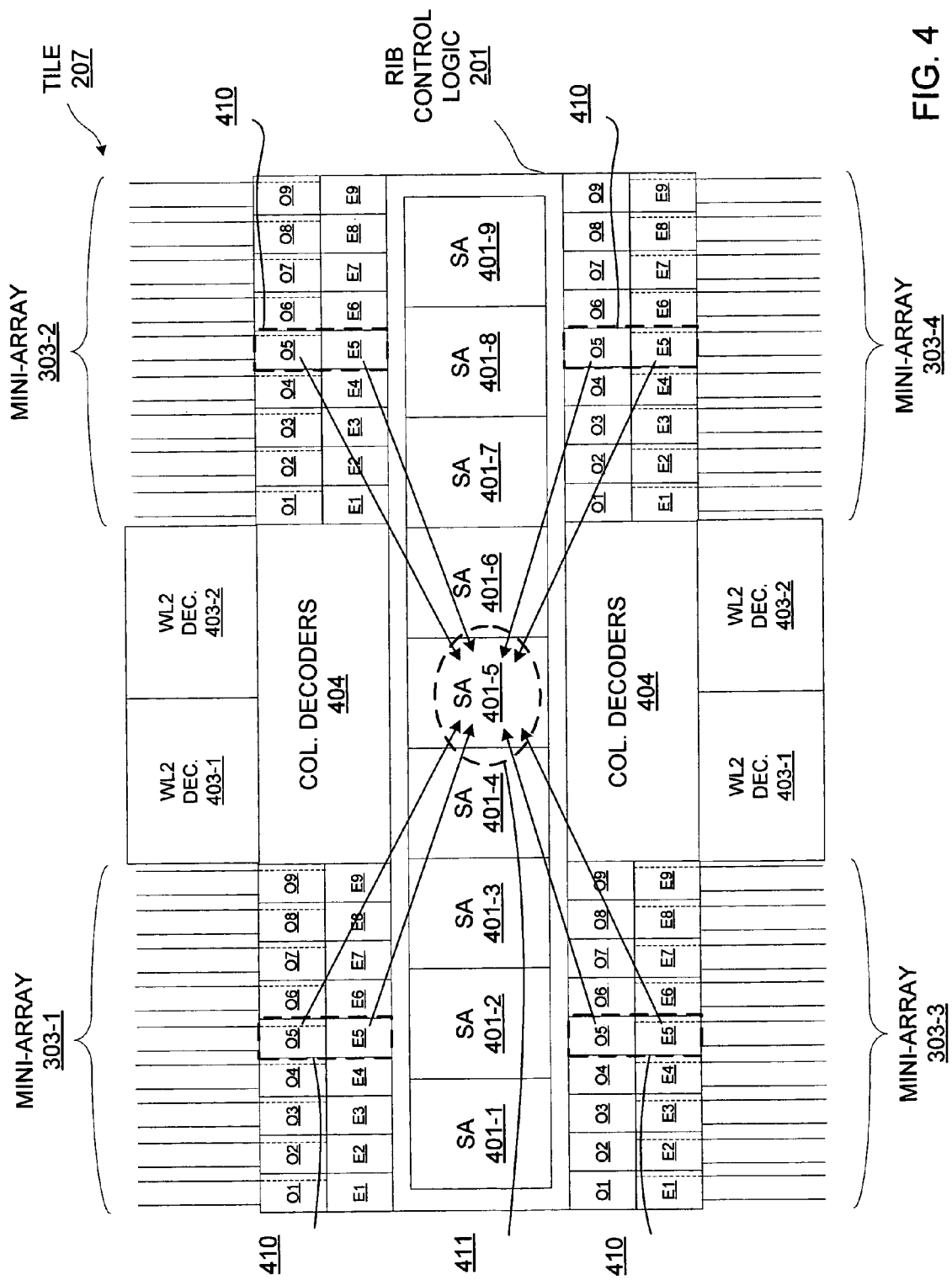
FIG. 4 is a simplified block diagram depicting an exemplary embodiment of a tile of FIG. 3.

FIG. 4 is a simplified block diagram depicting an exemplary embodiment of a tile 207. Tile 207 includes mini-arrays 303-1 through 3034. Notably, only four 18 bit wide mini-arrays 303-1 through 3034 are illustratively shown for purposes of clarity and not limitation. Disposed between mini-arrays 303-1 and 303-2 are WL2 decoders 403-1 and 403-2, as well as column decoders 404. Other column decoders 404 and WL2 decoders 403-1 and 403-2 may be located between mini-arrays 303-3 and 303-4.

As generally indicated, rib control logic 201 includes sense amplifiers ("SA") 401-1 through 401-9. Each sense amplifier 401-1 through 401-9 is coupled to eight mini-array columns for a read or a write operation. For example, suppose column five of each mini-array 303-1 through 303-4 were to be accessed for bits odd and even, as generally indicated by dashed boxes 410. Thus, column select signals provided from column decoders 404 would select memory cells associated with dashed boxes 410. These memory cells are denoted as odd 5 and even 5 ("O5 and E5") in each of memory arrays 303-1 through 3034. Thus, there are a total of eight memory cells, or more particularly eight columns as generally indicated by arrows 411, coupled to sense amplifier 401-5 as associated with the selected column.

In an architecture where a thyristor-based memory cell has a single-ended output to a bitline that is coupled to adjacent bitlines, this coupling may cause significant signal attenuation during a read operation. For example, if a target memory cell is storing a logic 0, meaning that little to no current from the memory cell passes to a bitline when read, and bitline adjacent memory cells are both storing logic 1 values, the read margin for reading the cell storing the logic 0 may be significantly reduced, for example by more than 50% due to coupling up of the bitline that was targeted to remain at the pre-charged Vss state. Accordingly, as described in more detail with reference to FIGS. 5 and 6, only alternate memory cells along a selected WL1 are accessed during a read. The interleaved unselected cells are held at a logic low voltage reference level, such as voltage Vss. By holding adjacent memory cells at a fixed voltage, data dependent cross-talk from such adjacent memory cells along an adjacent WL1 may be significantly reduced. By "shielding," it is generally meant holding one or more adjacent unaccessed bitlines at a fixed voltage to reduce or eliminate signal attenuation in a bitline being read. An example of an adjacent bitline is an interleaved bitline. Accordingly, it should be understood that by designating memory cells either odd or even, understanding interleaving access is facilitated.

Figure 5:
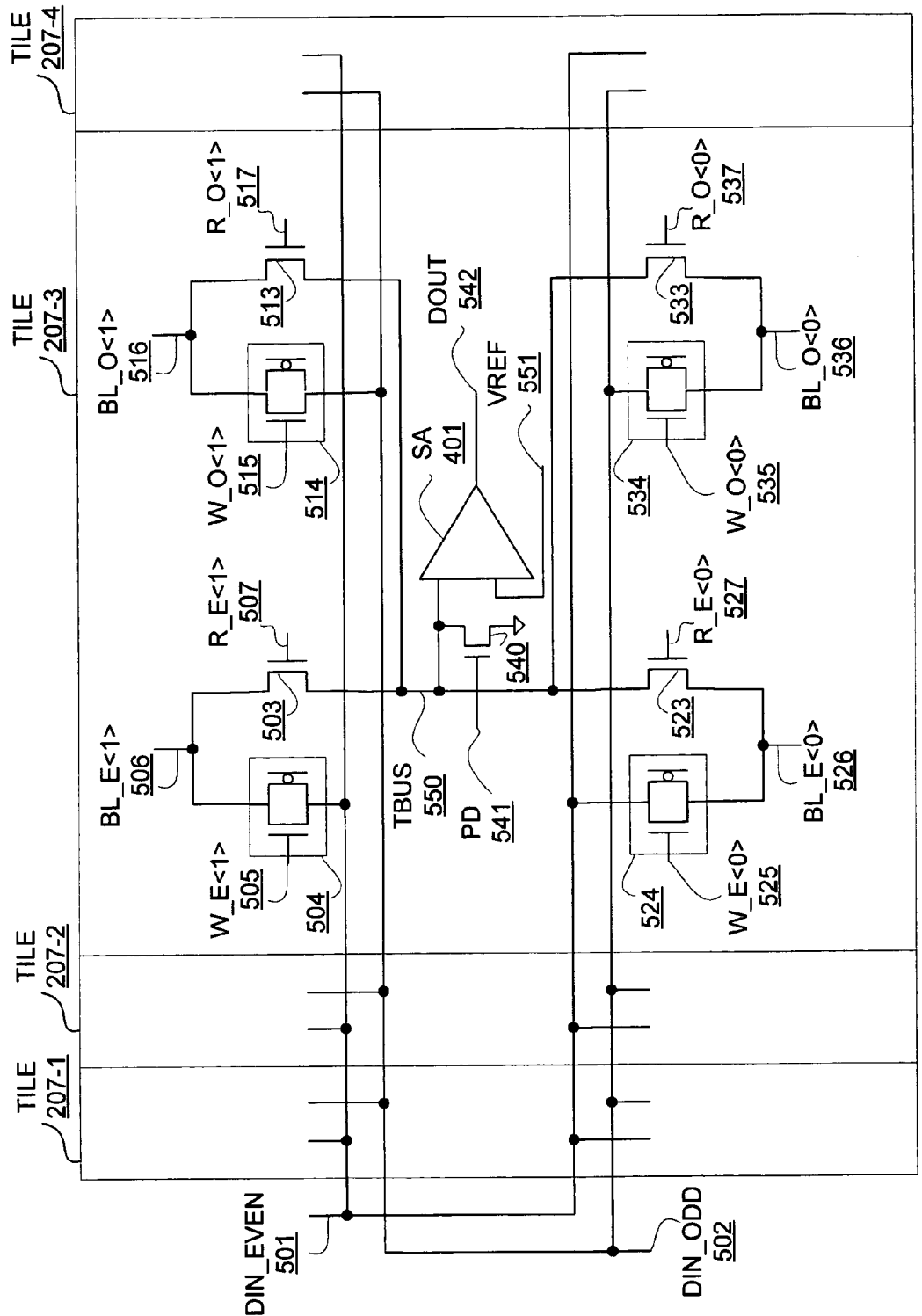
FIG. 5 is a schematic diagram depicting an exemplary embodiment of a plurality of the tiles of FIG. 4.

Referring to FIG. 5 there is shown a schematic diagram depicting an exemplary embodiment of a plurality of tiles 207-1 through 207-4. Tiles 207-1 through 207-4 are coupled to data input even signal line 501 and data input odd signal line 502. Though four example tiles are illustratively shown in FIG. 5, only tile 207-3 is shown in detail, as the same circuitry is repeated in each of the tiles. Furthermore, although eight tiles are illustratively shown in FIG. 3, FIG. 5 illustratively shows four tiles for purposes of clarity and not limitation.

With simultaneous reference to FIGS. 4 and 5, tile 207-3 of FIG. 5 is further described. For a read operation, seven of the eight columns, as generally indicated by reference to arrows 411, are unselected or electrically disconnect from bus ("TBUS") 550. Notably in FIG. 5, only four columns of tile 207-3 are illustratively shown, as the other four columns will employ the same logic. Thus, for a read operation, only a single selected column remains electrically connected to TBUS 550 responsive to a read column multiplexer. In this exemplary embodiment, control inputs to such a read column multiplexer are read even bit 1 signal 507, read odd bit 1 signal 517, read even bit 0 signal 527, and read odd bit 0 signal 537. Thus, a read column multiplexer is made up in part of transistors 503, 513, 523, and 533, which are respectively gated by signals 507, 517, 527, and 537. Again, only four of the columns are shown, so for purposes of clarity by way of example it shall be assumed that read odd bit 1 signal 517 is asserted to cause transistor 513 to be in a conductive state for a read operation, and signals 507, 527, and 537 are not asserted for the read operation meaning that transistors 503, 523, and 533 are in a substantially non-conductive state.

For a read operation, a pull-down signal ("PD") 541 is pulsed to a logic low level during a read portion of a read cycle in those tiles selected for reading information therefrom, namely tile 207-3 in this example. Notably, only NMOS devices are directly connected to TBUS 550 for this part of a read operation. Thus, voltage generally below about 200 millivolts may be used. Write multiplexers 504, 514, 524, and 534 are CMOS devices, as voltage for a write may be a logic high voltage reference level ("Vdd"). Write column multiplexers 504 and 524 are coupled to data input even signal line 501, and write column multiplexers 514 and 534 are coupled to data input odd signal line 502. Accordingly, a select input to multiplexer 504 is write even bit 1 signal 505, and a select input to write column multiplexer 524 is write even bit 0 signal 525. With respect to multiplexers 514 and 534, each is coupled to receive data input odd signal 502. Multiplexer 514 is coupled to receive write odd bit 1 signal 515 as a control select input, and write column multiplexer 534 is coupled to receive write odd bit 0 signal 535 as a select control input. Notably, a full CMOS pass gate is used to provide a full voltage swing between Vdd and Vss for both logic high and logic low inputs to a memory cell attached to a bitline, such as any of bitlines 506, 516, 526, and 536. Notably, for clarity, lines and signals are identified with the same reference.

Write column multiplexers 504, 514, 524, and 534 are decoded during a read portion of a cycle to provide the shielding function. Notably, columns associated with these write column multiplexers 504, 514, 524, and 534 are adjacent to one another within the same mini-array. For example, when bitline odd bit 1 signal 516 is being read and read odd bit 1 signal 517 is asserted to put transistor 513 in a conductive state, write column multiplexers 504 and 524 to even bitlines respectively associated with bitline even bit 1 signal 506 and bitline even bit 0 signal 526 in a selected mini-array 303-1 of FIG. 4 are activated. During such a read operation, all data input lines associated with data input odd signal 502, namely all 9 odd bits of a mini-array, are driven to a logic low level, and all data input lines associated with data input even signal 501, namely all 9 even bits of the mini-array, are read. As a selected memory cell, such as coupled to the bitline associated with bitline odd bit 1 signal 516 in this example, is activated by a WL1 read signal being asserted, the bitline associated with bitline odd bit 1 signal 516 and TBUS 550 are either pulled high, such as within a range of approximately 100 to 200 millivolts, in the instance of reading a stored logic 1 or left at a grounded precharged state in the instance of reading a stored logic 0. A reference voltage ("VREF") 551 is generated to drive the other input to differential sense amplifier 401. This reference voltage 551 may be slightly below the midpoint between the voltage for a read logic 0 voltage level and a read logic 1 voltage level. TBUS 550 is coupled to one input of differential sense amplifier 401 for reading out the value stored in a selected memory cell, namely data output signal 542. As previously mentioned, the TBUS signal 550 is pulled down to ground by assertion of pull-down signal 541 as applied to transistor 540 for unselected ribs and during the beginning of a "slot" portion of a cycle for all locations, namely both selected and unselected ribs.

A write operation begins with a read operation with the same timing as previously described. For a write operation, a write address is decoded to a shield location, namely even is decoded as odd and vice versa in this example. Thus data is read from an accessed location, including all associated locations, namely the nine other memory cells that are not targeted to be written in a row of a mini-array 303-3 of FIG. 4, for example, and is read by each sense amplifier 401-1 through 404-9. The read data is loaded into nine data input buffers in the example of data input buffer 304. In parallel, data to be written is transferred from data input pads of memory 100 to nine other data input buffers in the example of data input buffers 304. Once these 18 data input buffers of data input buffer 304 are loaded, a write operation may proceed from there.

For a write operation, a WL1 to be accessed is held at logic high level, but a local WL2 to be accessed is pulsed high in order to write 18 bits respectively into all 18 selected memory cells of a mini-array, such as mini-array 303-3 of FIG. 4. Notably, the unselected mini-arrays, such as mini-arrays 303-1, 303-2, and 3034, within a selected tile 207 remain tied to TBUS 550, which is held at ground responsive to assertion of pull-down signal 541 during a write to such selected mini-array 303-3 in this example.

Figure 6:
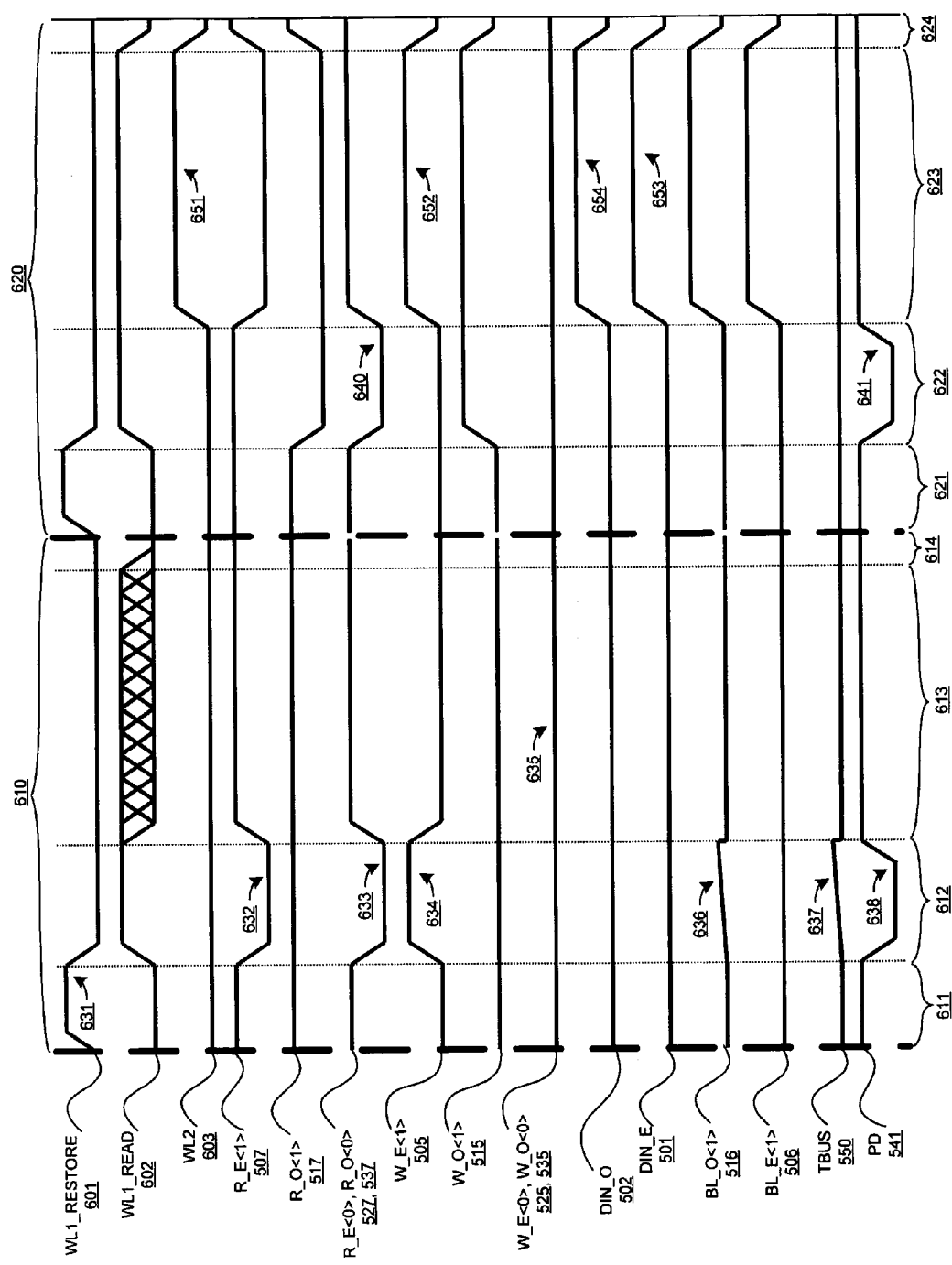
FIG. 6 is a timing diagram for the timing of read and write operations of the memory array block of FIG. 2.

In order to provide a more thorough understanding of read and write timing, there is shown in FIG. 6 a timing diagram for the above-described timing of read and write operations. With reference to FIG. 6, restore, read, and write timing is further described. Two operating cycles 610 and 620 are illustratively shown in FIG. 6. Cycle 610 is for a read operation and cycle 620 is for a write operation. Cycle 610 has a restore timing interval 611, a read timing interval 612, an unused timing interval 613, and a pre-charge timing interval 614. Cycle 620 has a restore timing interval 621, a read timing interval 622, a write timing interval 623, and a pre-charge timing interval 624. Notably, memory cells to be accessed during cycle 610 or 620 may or may not be restored during such cycle 610 or 620, respectively.

With reference to cycle 610, during restore timing interval 611, a WL1 restore signal 601 is provided with a pulse 631. In this example, during restore timing interval 611, WL1 read signal 602 is held at a logic low level, as is WL2 signal 603. Notably, the WL1 being accessed for applying a restore pulse 631 may be the same WL1 to be read, or pre-read for a write. However, for clarity, pulse 631 is not shown as part of signal 602, meaning that the WL1 to be accessed is not presently being restored for either of cycles 610 and 620. All write even and odd signals 505, 515, 525, and 535 are held at logic low levels as a default state for a restore operation. Furthermore, in accordance with a restore operation, all read signals, such as read signals 507, 517, 527, and 537 are held at a logic high level as a default state for a restore operation in order to hold the bitlines at ground by electrically connecting them all to TBUS 550, which is held at ground by activated n-channel device 540. By raising WL1 with the bitline held at ground, both data states of a thyristor storage element may be restored to full value.

During a read timing interval 612 of cycle 610, WL1 restore signal 601 has transitioned back to a logic low level, and correspondingly WL1 read signal 602 has been asserted for a read operation. Notably, all even bits of a mini-array are read at a time during a same read timing interval for reading even bits, and all odd bits of a mini-array are read at a time during a same read timing interval for reading odd bits. For purposes of clarity by way of example and not limitation, it shall be assumed that this read operation is a read of a logic 1 from bitline odd bit 1 signal 516. For a read operation, WL2 signal 603 is held at a logic low level. Because this is a read of the odd bitlines, read even bit signals 507 and 527 are transitioned from a logic high level to a logic low level. However, read odd bit 1 signal 517 and read odd bit 0 signal 537 are held at a logic high level for the read of the memory cell associated therewith.

Write even bit signals 505 and 525 are pulsed high to hold down the even bitlines while the odd bitlines are being read, as generally indicated by pulse 634. Read signals 507 and 527 are pulsed low for this read operation as generally indicated by pulse 632. In other words, by asserting write even bit signals 505 and 525, data input even signal 501 is coupled to the even bitlines. Because this is a read of memory cells associated with the odd bitlines of a mini-array as associated with signals 516 and 536, write odd bit signals 515 and 535 are held at a logic low level. It should be understood however, that data input even signal 501 is held low and is used to pull down the even bitlines adjacent to the odd bitlines being read.

With continuing reference to FIG. 6, and renewed reference to FIG. 5, a read operation for cycle 610 is further described. Because WL1 read signal 602 is asserted, charge stored in a memory cell associated therewith for a read of a logic 1 is provided to a bitline associated with bitline odd bit 1 signal 516. Accordingly, as indicated voltage on bitline odd bit 1 signal 516 transitions upward for a read of a logic 1 in accordance with this example as generally indicated by pulse 636. Again, as previously mentioned, bitline even bit 1 signal 506, as well as all other even bitlines in the same mini-array, is held at a logic low level responsive to data input even signal 501 to reduce coupling for a read of a logic 1 from an adjacent bitline. Bitline odd bit 1 signal 516 propagates through transistor 513 and thus appears as TBUS signal 550 as generally indicated by pulse 637. Because this is a read operation, sense amplifier 401 is to be used to sense this voltage on TBUS signal 550, and accordingly pull-down signal 541 is de-asserted as generally indicated by inverse pulse 638.

Transitioning from read timing interval 612 to unused timing interval 613, only signals states which changed are described below for purposes of clarity and not limitation. Unused timing interval 613 is unused during a read cycle, and write timing interval 623 is used during write cycle 620 for a bit cell write operation. Notably, between cycle 610 and 620 there is a transition region 614, which is generally indicated as part of cycle 610. To transition from a read, all signals may stay in the same state. However, if WL1 read signals 602 is held at a logic high level through unused timing interval 613, it is transitioned from such logic high level to a logic low level during pre-charge timing interval 614. Accordingly, if WL1 read signal 602 is transitioned from a logic high level to a logic low level when going from read timing interval 612 to unused timing interval 613, pre-charge timing interval 614 may be omitted.

The above example of cycle 610 was for a read of a logic 1 from a bitline associated with bitline odd bit 1 signal 516. For purposes of clarity by way of example and not limitation, cycle 620 is an example of a write of a logic 0 to the bit associated with bitline odd bit 1 signal 516 when there is a logic 0 stored in the memory cell associated with a bitline of bitline even bit 1 signal 506. Notably, restore timing interval 621 associated with cycle 620 is the same as restore timing interval 611 associated with cycle 610, and such description accordingly is not repeated here.

During read timing interval 622, WL1 restore signal 601 is transitioned to a logic low level, and WL1 read signal 602 is transitioned to a logic high level. This transition of WL1 read signal 602 is to read odd bits adjacent to the even memory cells which will be written. WL2 signal 603 is held low during this read time interval 622.

A write of a logic 0 to a memory cell associated with bitline odd bit 1 signal 516, in addition to all other odd bitlines in the same mini-array, is used for this example. Again, a logic 0 is assumed to be stored in the adjacent even memory cell, namely the memory cell associated with bitline even bit 1 signal 506.

Again, adjacent even memory cells are read prior to writing to the target odd memory cell coupled to the same WL2. Notably, though a group of nine even or odd memory cells are read or pre-read, the example of one of those memory cells is described below, as it directly follows that the others may likewise be read for subsequent buffering. For this to occur, read even bit 1 signal 507 is held at a logic high level and read signals 517, 527, and 537 are transitioned to logic low levels. Thus, in the example of FIG. 5, transistors 513, 523, and 533 are in non-conductive states and transistor 503 is in a conductive state to read data from the memory cell associated with bitline even bit 1 signal 506. During read timing interval 622, pull-down signal 541 is de-asserted to allow data to propagate along TBUS 550 to sense amplifier 401, where TBUS 550 is electrically decoupled from ground responsive to inverse pulse 641. This read of a logic 0 is generally indicated by bitline even bit 1 signal 506 being at a logic low level and correspondingly TBUS signal 550 being at a logic low level.

To hold the adjacent bitline to ground during this read operation, write odd bit 1 signal 515 is transitioned from a logic low level to a logic high level. Thus the bitline associated with bitline odd bit 1 signal 516 is coupled to data input odd signal 502. Data input odd signal 502 and data input even signal 501 are maintained at a logic low level during read timing interval 622, which couples the bitline associated with bitline odd bit 1 signal 516 to a logic low level. Notably, as the memory cell associated with bitline even bit 1 signal 506 is being read, write even bit 1 signal 505, write even bit 0 signal 525, and write odd bit 0 signal 535 are held at a logic low level, as well as is data input even signal 501.

Thus it should be understood that a memory cell bit has been read via a bitline which is adjacent to a bitline having another memory cell which is about to be written to. Notably, even and odd memory cells are physically interleaved with each other, namely one is an odd cell and the other is an even cell. Moreover, it should be understood that all such opposite memory cells may be read for interleaved reading, as previously described, for subsequent write back, namely a "read-before-write." For write timing interval 623, WL1 restore signal 601 is maintained at a logic low level and WL1 read signal 602 is maintained at a logic high level. Thus, for a write operation, WL1 read signal 602 is held at a logic high level to gain access to a storage element of a memory cell. Moreover, to gain access to such a storage element for a write operation, WL2 signal 605 transitions from a logic low level to a logic high level as generally indicated by pulse 651.

For writing a logic 0 to an odd memory cell, both the odd memory cell and its even counterpart are decoupled from TBUS 550. Accordingly, read even bit 1 signal 507 and read odd bit 1 signal 517 are at a logic low level, where the former is transitioned from a logic high level to logic low level, for write timing interval 623. In contrast, read signals 527 and 537 in the unwritten portion of the mini-array are transitioned from a logic low level to a logic high level, as is pull-down signal 641. Accordingly, pull-down signal 641 couples TBUS 550 to ground via transistor 540. Thus, because read even and odd signals 527 and 537 are asserted, those associated bitlines are likewise coupled to ground via TBUS 550 and transistors 523 and 533 respectively. Accordingly, TBUS signal 550 is indicated as being at a logic low level, which is responsive to pull-down signal 541 being asserted during write timing interval 623. Moreover, write signals 525 and 535 will be held at a logic low level to avoid transmitting write data from data input even signal 501 and data input odd signal 502 into an unselected portion of the mini-array, as data input for a write operation will be active.

During write timing interval 623, write odd bit signal 515 and write even bit signal 505 are maintained at a logic high level. Write even bit 1 signal 502 is transitioned from a logic low level to a logic high level as generally indicated by pulse 652, because the pre-read operation of the even bits within the selected mini-array read the zero value of data on bitline 506 and stored the result in the local data input buffer. Thus, bitlines associated with bitline even bit 1 signal 506 and bitline odd bit 1 signal 516 are respectively coupled to data input even signal 501 and data input odd signal 502 via multiplexers 504 and 514. Continuing the example of a write of a logic 0 on odd bitlines in combination with a logic 0 on even bitlines, data input even signal 501 and data input odd signal 502 are transitioned from logic low levels to logic high levels, as generally indicated by pulses 653 and 654, respectively. Because a logic 0 is stored in the adjacent even bitline in this example, both data input odd signal 502 and data input even signal 501 are transitioned to logic high levels to write a logic 0 to their respective memory cells. However, if for example data input even signal 501 were to write back a logic high as previously read in shielding timing interval 622, data input even signal 501 would not be transitioned to a logic high level. However, continuing the example of providing logic high inputs to write logic 0s to memory cells, bitline signals 506 and 516 will correspondingly transition from logic low levels to logic high levels respectively responsive to pulses 653 and 654. Notably, for a thyristor-based memory cell, by applying a logic high level to a bitline and coupling the bitline to the storage node, a thyristor-based storage element may be put into a current-blocking state.

After write timing interval 623, a transition from write timing, namely transition interval 624, may take place. During transition interval 624, WL1 read signal 602, WL2 signal 603, write even bit 1 signal 505, write odd bit 1 signal 515, data input signals 501 and 502, and bitline signals 506 and 516 are all transitioned from a logic high level to a logic low level. During transition interval 624, WL1 restore signal 601, read signals 527 and 537, write signals 525 and 535, TBUS signal 550, and pull-down signal 541 do not transition. Lastly, during transition interval 624, read signals 507 and 517 are transitioned from a logic low level to a logic high level.

Accordingly, it should be appreciated that there is a different hierarchy for WL1, WL2, data input, and TBUS signaling. Furthermore, it should be appreciated that all operations for a read or write may be done within a single cycle to avoid write buffering.

Figure 7A:
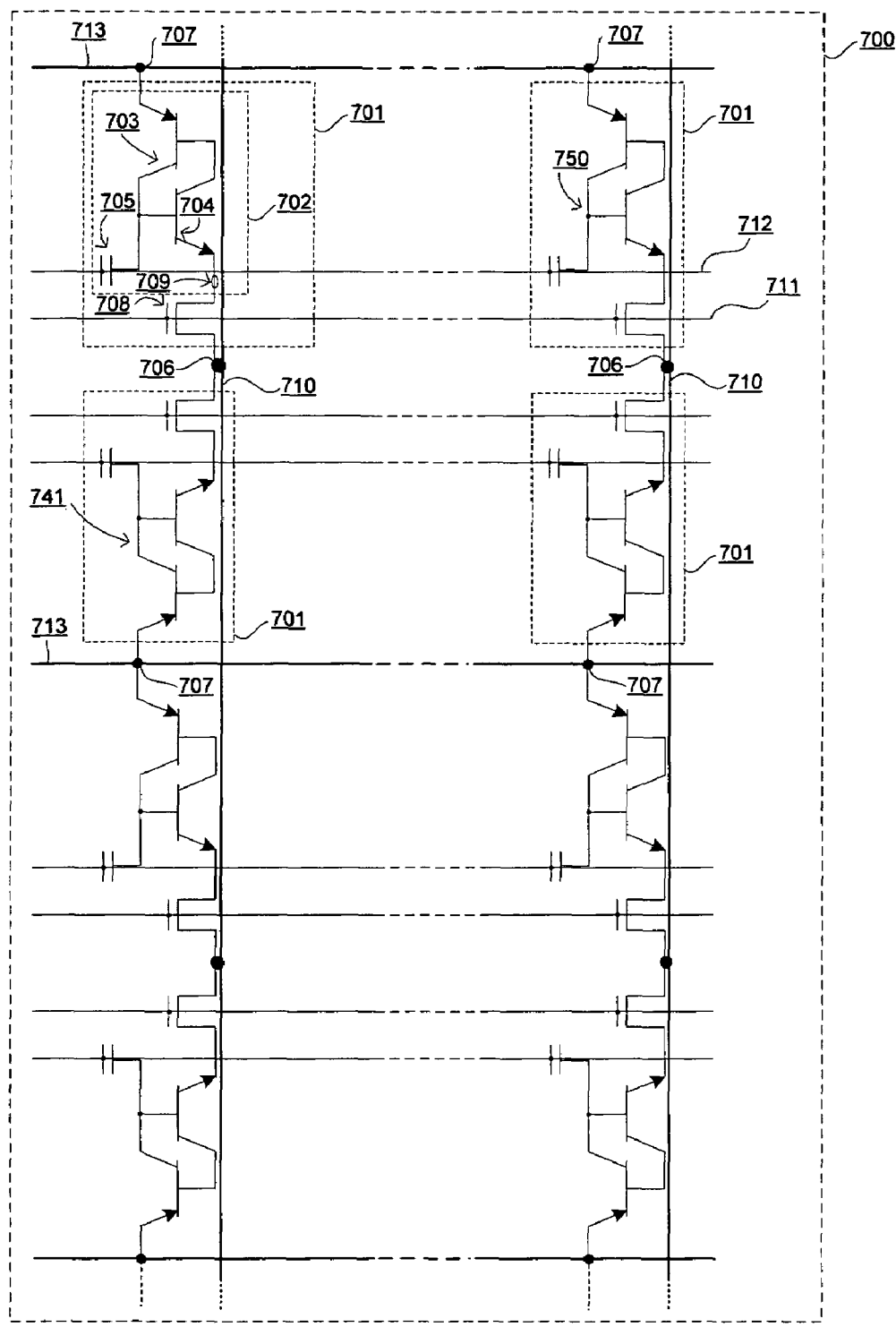
FIG. 7A is a schematic diagram depicting an exemplary embodiment of a memory array that includes thyristor-based memory cells.

FIG. 7A is a schematic diagram depicting an exemplary embodiment of a memory array 700. Memory array 700 includes thyristor-based memory cells 701. Pairs of memory cells 701 may be commonly coupled at a bitline contact 706 for connection to a bitline 710 and may be commonly coupled at a reference voltage contact 707 for connection to a reference voltage line 713. Notably, voltage on reference voltage line 713 may be used as an anodic voltage for memory cell 701. Accordingly, reference to this reference voltage includes its anodic use, and as such it is referred to herein as "VDDA" to clearly distinguish it from Vdd. Thus, reference voltage line 713 is subsequently referred to herein as anode voltage line 713, and reference voltage contact 707 is subsequent referred to herein as anode contact 707.

Each memory cell 701 includes an access device ("transistor") 708, which may be a field effect transistor ("FET"), and a thyristor-based storage element 702. Notably, access device 708 need not be a transistor; however, for purposes of clarity by way of example access device 708 shall be referred to herein as transistor 708. Storage element 702 and transistor 708 may be commonly coupled at a storage node 709. Storage node 709 may be a cathodic node of storage element 702 and a source/drain node of transistor 708.

Illustratively shown in FIG. 7A is an equivalent circuit model of storage element 702 having cross coupled bi-polar junction transistors ("BJTs") 703 and 704, as well as capacitor 705. Storage element 702 may be a type of a device known as Thin Capacity Coupled Thyristor ("TCCT") device. Again, in this example, storage element 702 is coupled in series with an n-MOS transistor 708 to provide memory cell 701. However, a p-MOS architecture may be used.

For each memory cell 701, a gate of access transistor 708 is formed from a wordline ("WL1") 711 in relation to an active area, as generally indicated in FIG. 7A by small dots coupling gates of access transistors 708 to WL1s 711. A control gate of storage element 702, generally indicated as a plate of capacitor 705, is formed with another wordline ("WL2") 712, as generally indicated by small dots coupling plates of capacitor 705 to WL2s 712. Though only a few rows of memory cells 701 are illustratively shown in FIG. 7A, it should be appreciated that many more rows may be used. The exact number of memory cells or bits associated with a WL1 711 or a WL2 712 may vary from application to application. However, for purposes of clarity by way of example and not limitation, it shall be assumed that there are 144 memory cells coupled to each WL1 711 and 18 memory cells coupled to each WL2 712, though other numbers for either or both may be used.

An emitter node of BJT 703 is coupled to anode voltage line 713 by anode contact 707. A base of BJT 703 is coupled a collector of BJT 704. An emitter of BJT 704 is coupled to storage node 709. A base of BJT 704 and a collector of BJT 703 are commonly coupled to a bottom plate of capacitor 705, and this common coupling location may be generally referred to as storage node 750.

Figure 7B:
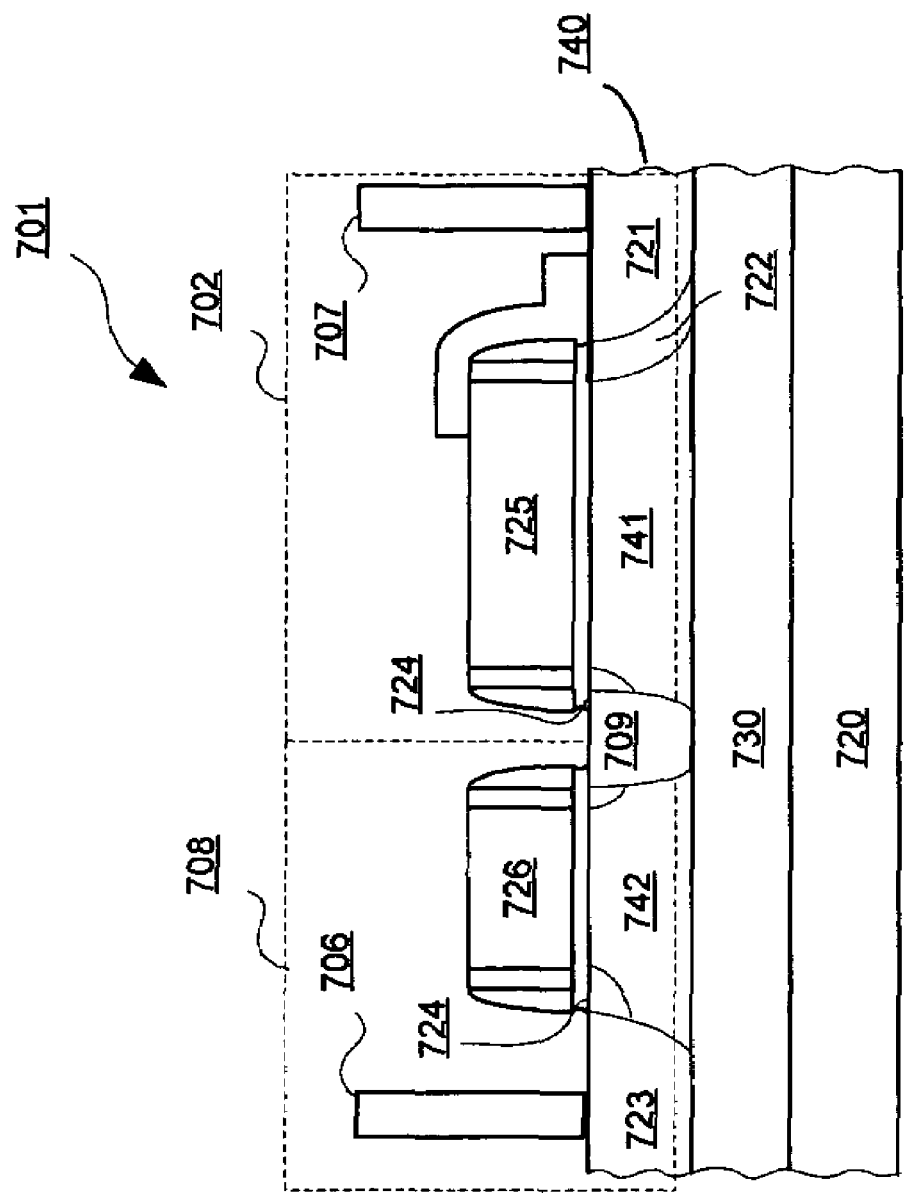
FIG. 7B is a cross-sectional view depicting an exemplary embodiment of a device structure for a memory cell of the memory array of FIG. 7A.

FIG. 7B is a cross-sectional view depicting an exemplary embodiment of a device structure for a memory cell 701 of FIG. 7A. In this embodiment, memory cell 701 is formed using a silicon-on-insulator ("SOI") wafer having a substrate layer 720 on which a buried oxide ("BOx") layer 730 is formed. Formed on BOx layer 730 is an active silicon layer 740. Though an SOI wafer is generally illustrated in FIG. 7B, other known types of semiconductor wafers may be used.

In active silicon layer 740, anode region 721, base region 722, cathode region 709, and bitline access region 723 are formed. Between base region 722 and cathode region 709 is another base region 741 of storage element 702. Between storage node 709 and access region 722 is access device body region 742. In an embodiment, regions 721, 741, and 742 may be p-type regions, and regions 709, 722, and 723 may be n-type regions. Above regions 741 and 742 may be formed one or more dielectric layers 724. Above one or more dielectric layers 724 may be formed wordlines 711 and 712 of FIG. 7A, which in association with regions 741 and 742 are defined gates 725 and 726, respectively. Gate 725 is a gate of transistor 708 and an access gate of memory cell 701, and gate 726 is a control gate of storage element 702 and a write gate of memory cell 701. An anode contact 707 is coupled to anode region 721, and a bitline contact 706 is coupled to access region 723. Notably, access region 723 and storage node 709 also serve as source/drain regions of transistor 708. Other details regarding memory cell 701, including silicides, extension regions, and spacers, among other known details, may be found in U.S. Pat. Nos. 6,767,770 B1 and 6,690,039 B1.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit having memory, comprising:
   an array having memory cells, the array having bitlines coupled to the memory cells;
   data input lines coupled to the bitlines via write multiplexers responsive to write signals;
   a data bus coupled to the bitlines via respective read transistors respectively gated responsive to read signals;
   a voltage pulling circuit coupled to the data bus;
   a sense amplifier coupled to the bitlines via the read transistors and the data bus, the sense amplifier coupled to receive a reference voltage; and
   the write signals and the read signals in part configured to shield at least one adjacent bitline to a bitline of a memory cell of the memory cells being read.

2. The integrated circuit according to claim 1, wherein at least one of the data input lines are pulled to a voltage level to shield the at least one adjacent bitline.

3. The integrated circuit according to claim 2, wherein the read signals include even read signals and odd read signals.

4. The integrated circuit according to claim 2, wherein the write signals include even write signals and odd write signals.

5. The integrated circuit according to claim 2, wherein the data input lines include a date even input line and a data odd input line.

6. The integrated circuit according to claim 5, wherein the voltage pulling circuit is a transistor coupled to ground and gated responsive to a pull-down signal.

7. The integrated circuit according to claim 5, wherein the read transistors in combination provide a read multiplexer.

* * * * *